(12) United States Patent
Seo

(10) Patent No.: US 7,030,454 B2
(45) Date of Patent: Apr. 18, 2006

(54) SEMICONDUCTOR DEVICES AND METHODS OF FORMING A TRENCH IN A SEMICONDUCTOR DEVICE

(75) Inventor: Young-Hun Seo, Bucheon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/745,028

(22) Filed: Dec. 23, 2003

(65) Prior Publication Data

US 2004/0135199 A1    Jul. 15, 2004

(30) Foreign Application Priority Data

Dec. 24, 2002    (KR)    ............ 10-2002-0083439

(51) Int. Cl.
*H01L 29/00*    (2006.01)

(52) U.S. Cl. ...................... 257/501; 257/510
(58) Field of Classification Search .......... 257/301, 257/501, 510; 438/424, 435, 437
See application file for complete search history.

(56) References Cited

U.S. PATENT DOCUMENTS

| | | | |
|---|---|---|---|
| 6,096,612 A * | 8/2000 | Houston | 438/296 |
| 6,323,104 B1 * | 11/2001 | Trivedi | 438/424 |
| 6,350,661 B1 | 2/2002 | Lim et al. | 438/424 |
| 6,403,445 B1 | 6/2002 | Gardner et al. | 438/424 |
| 6,406,987 B1 | 6/2002 | Huang | 438/595 |
| 6,420,770 B1 | 7/2002 | Xiang et al. | 257/506 |
| 6,727,150 B1 * | 4/2004 | Tang | 438/296 |
| 2003/0203580 A1 * | 10/2003 | Choo et al. | 438/296 |

* cited by examiner

*Primary Examiner*—T. N. Quach
(74) *Attorney, Agent, or Firm*—Andrew D. Fortney

(57) ABSTRACT

Semiconductor devices and methods to form a trench in a semiconductor device are disclosed. A disclosed process comprises: forming a hollow by etching a portion of a semiconductor substrate; forming a side wall layer in an inner side wall of the hollow; forming a trench by further etching the semiconductor substrate exposed through the bottom of the hollow; and filling the trench by forming an insulation film on the side wall layer and the trench.

15 Claims, 2 Drawing Sheets

US 7,030,454 B2

SEMICONDUCTOR DEVICES AND METHODS OF FORMING A TRENCH IN A SEMICONDUCTOR DEVICE

FIELD OF THE DISCLOSURE

This disclosure relates generally to semiconductor devices, and more particularly to methods of forming a trench formed as a field region in a semiconductor device to isolate one active region from another with insulation material without any voids.

BACKGROUND

STI (shallow trench isolation) structures have been widely used as isolation structures in semiconductor devices. These STI structures facilitate the miniaturization of semiconductor devices since the size of the field region is limited to a desired size of a trench by forming the trench in the semiconductor substrate and filling the trench with insulation material.

Conventionally, in forming a trench isolation structure, a pad oxide film is deposited at a thickness of about 200 Å on a semiconductor substrate. A silicon nitride film is then deposited on the pad oxide film. Subsequently, a photosensitive film is applied and exposed on the silicon nitride film. The photosensitive film is then formed into a pattern by removing only the portion of the photosensitive film covering the region to be processed to define the trench.

Next, the trench is formed in the semiconductor substrate by dry etching the exposed silicon nitride film, the pad oxide film, and the semiconductor substrate up to a predetermined depth while using the photosensitive film pattern as a mask. Subsequently, the photosensitive film pattern is removed. A cleaning process is then performed.

Subsequently, a liner oxide film is formed on an entire surface of the silicon nitride film (including on an inner wall of the trench). A trench oxide film is then thickly deposited on the liner oxide film such that the trench is sufficiently filled.

The trench oxide film is then planarized by a chemical mechanical polishing process until the silicon nitride film is exposed. Finally, the silicon nitride film is removed to complete the trench isolation process.

In the conventional trench isolation structure, stress is concentrated on an edge of the trench. In addition, this edge of the trench is likely hollowed since the liner oxide film and a portion of the trench oxide film are etched together when the silicon nitride film is wet etched. This may make the edge of the trench fragile.

Moreover, as semiconductor devices become more and more integrated, contacts become more susceptible to misalignment with the fragile edge of the trench. This misalignment may cause leakage current due to contact spiking, which may cause fatal defects in the semiconductor device.

Conventional techniques for preventing this leakage current of the trench due to misalignment of the contacts are described in U.S. Pat. Nos. 6,420,770, 6,406,987, 6,403,445, and 6,350,661.

Presently, using up to a 0.18 μm design rule, a contact pattern can be formed with a distance of 0.2–0.3μm between the contact and the trench without misalignment. However, as the semiconductor device becomes more highly integrated, for example, by a 0.15 μm or 0.13 μm design rule and the like in the future, the distance between the contact and the trench becomes 0.1 μm, 0.0 μm, etc, (i.e., there is no margin for the contact alignment), and the current patterning processes cannot integrate the semiconductor device.

DETAILED DESCRIPTION

In view of the foregoing, the present disclosure recognizes that there is a need for a new structured trench and a new formation process thereof in order to realize more highly integrated semiconductor devices. Hereinafter, an example method of fabricating a semiconductor device incorporating such a trench will be described in detail with reference to the accompanying drawings.

Figure 1A:
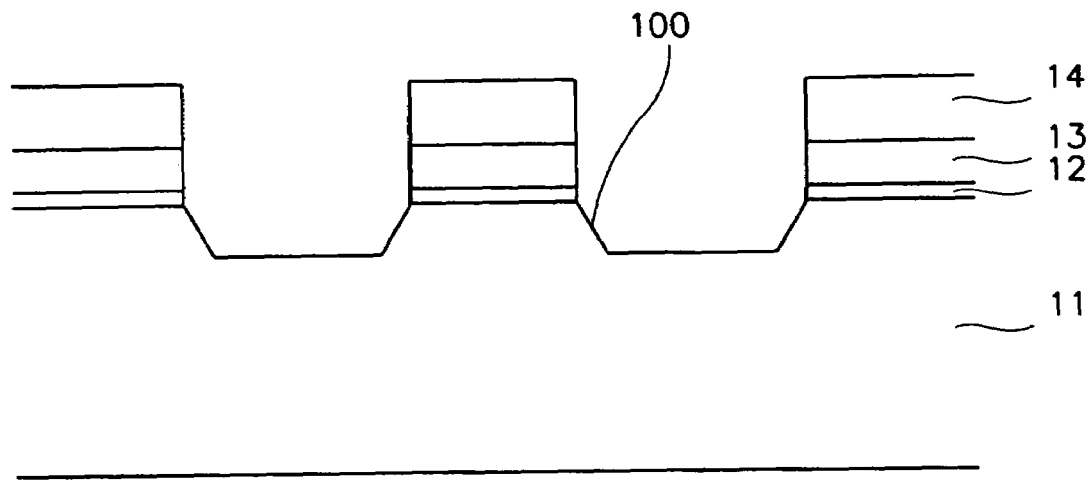
FIGS. 1a to 1e are cross-sectional views illustrating an example method of forming a trench in a semiconductor device in accordance with the teachings of the present disclosure.

FIGS. 1a to 1e are cross-sectional views illustrating an example method of forming a trench in a semiconductor device. First, as shown in FIG. 1a, a pad oxide film 12 is thinly deposited on a semiconductor substrate 11. A first silicon nitride film 13 is deposited on the pad oxide film 12. A photosensitive film is applied and exposed on the first silicon nitride film 13. A pattern is then formed in the photosensitive film 14 by removing only the portion (s) of the photosensitive film on the region(s) in which the trench (es) are to be formed.

The pad oxide film 12 is optionally deposited in order to prevent or reduce stressing of the first silicon nitride film 13 from being transferred to the semiconductor substrate 11. The pad oxide film 12 is preferably deposited thinly, for example, at a thickness of about 100–300 Å.

Since the first silicon nitride film 13 is made of a material having a high selectivity over the pad oxide film 12, the first silicon nitride film 13 functions as a termination layer in a subsequent chemical and mechanical polishing process for a trench oxide. The first silicon nitride film 13 is preferably deposited at a thickness of about 1500–3000 Å, for example, a thickness of about 2000 Å.

Although in the illustrated example, the pad oxide film 12 and the first silicon nitride film 13 are formed, persons of ordinary skill in the art will appreciate that the pad oxide film 12 and the first silicon nitride film 13 are optional and may be not formed.

After the photosensitive film 14 is patterned, a hollow 100 is formed by etching the exposed first silicon nitride film 13, the pad oxide film 12, and the semiconductor substrate 11 up to a predetermined depth using the photosensitive film pattern 14 as a mask. Subsequently, the photosensitive film pattern 14 is removed, and then a cleaning process is performed.

The depth of the hollow 100 preferably corresponds to the thickness of a side wall layer to remain in a subsequent etch back process. In consideration of this, the hollow 100 is formed by etching the semiconductor substrate 11 such that the depth of the hollow 100 is thinner than a desired depth of the trench.

Figure 1B:
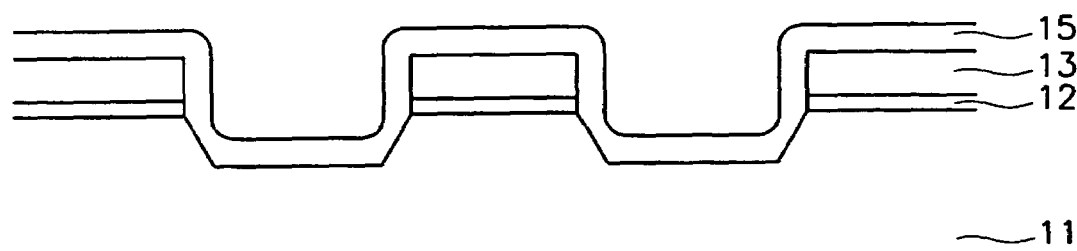
Figure 1C:
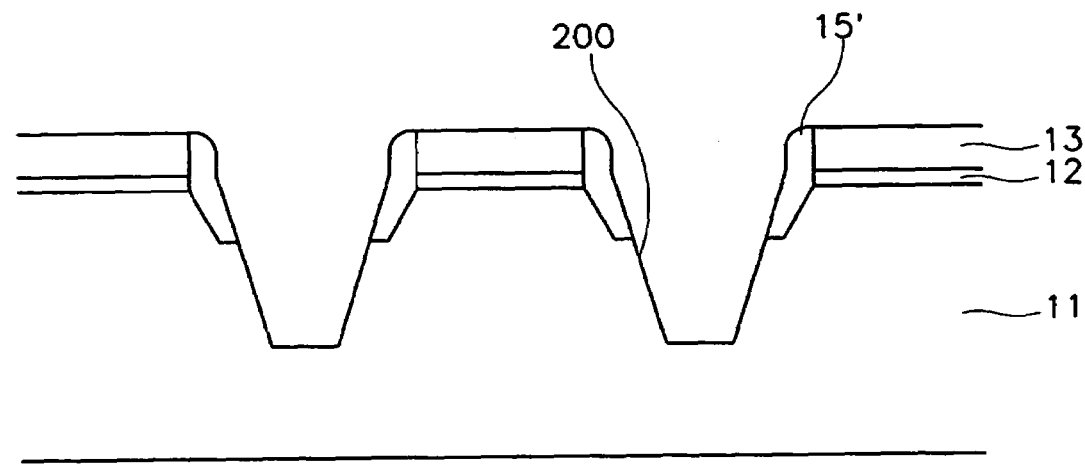

Next, as shown in FIG. 1b, a second silicon nitride film 15 is deposited as a sacrificial layer on an entire surface of the first silicon nitride film 13 and an inner wall of the hollow 100. Next, the first silicon nitride film 13 and the semiconductor substrate 11 on the bottom of the hollow 100 are exposed while leaving the second silicon nitride film 15 on a side wall of the hollow 100 to form a side wall layer 15', as shown in FIG. 1c.

The thickness of the sacrificial layer 15 is preferably selected such that the side wall layer 15' has a width of about 200–400 Å measured from the side wall of the hollow 100. When viewed from an entire sectional view, the side wall layer 15' is formed on both side walls of the hollow.

Subsequently, a trench 200 is formed by further etching the semiconductor substrate 11 exposed on the bottom of the hollow 100 up to the desired depth of the trench (see FIG. 1c).

Figure 1D:
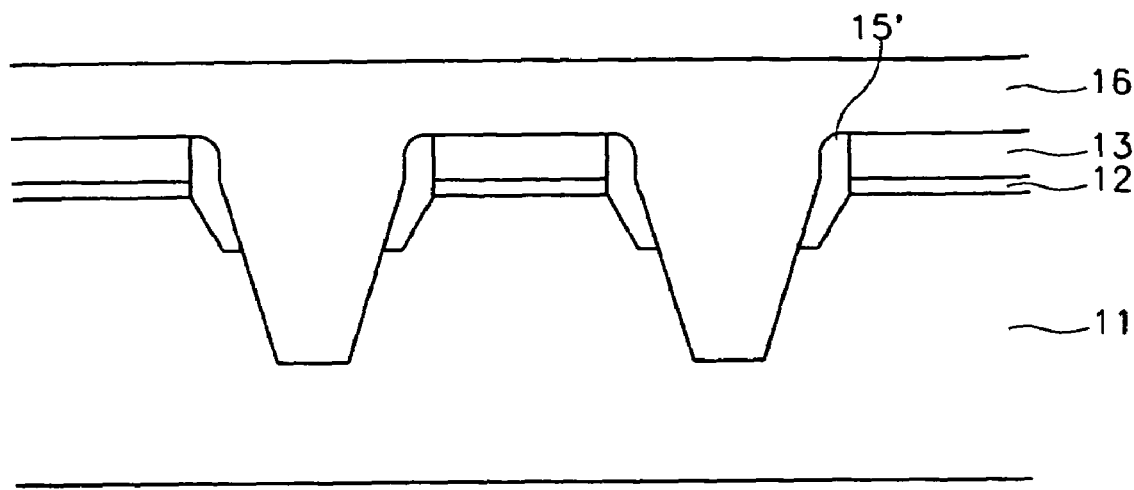

Next, as shown in FIG. 1d, an insulation film 16 is thickly deposited on the entire top surface of the first silicon nitride film 13, the side wall film 15' and the trench.

Figure 1E:
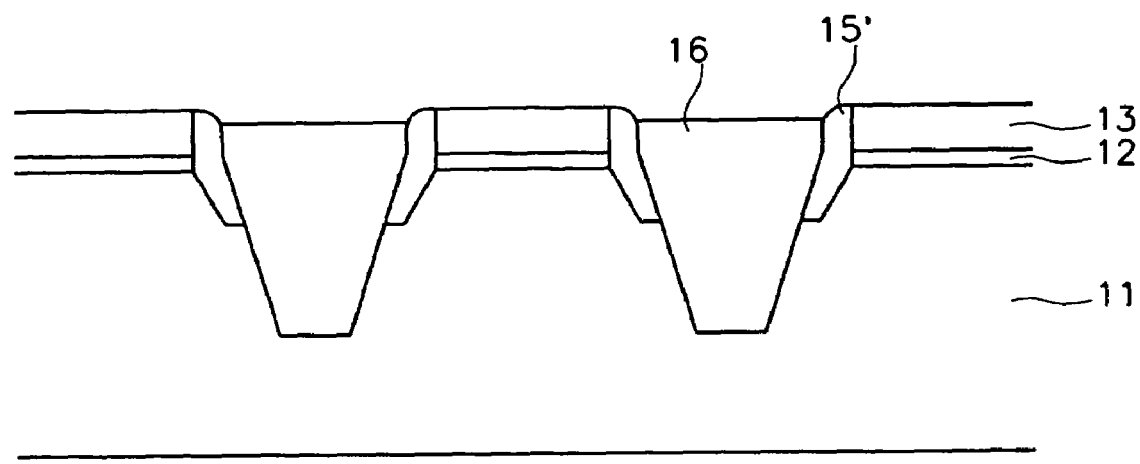

Then, as show in FIG. 1e, the trench isolation process is completed by chemically mechanically polishing the insulation film 16 until the first silicon nitride film 13 is exposed.

The insulation film 16 can be formed, for example, of an oxide film.

Before the insulation film 16 is formed, a liner oxide layer can be formed on the side wall layer 15' and the trench. In such a case, the trench is filled by forming the insulation film on the liner oxide layer.

As apparent from the above description, the hollow 100 is formed by etching the semiconductor substrate first. The nitride film 15 is then deposited on the inner wall of the hollow 100. The side wall layer 15' is then formed by etching back the nitride film 15. Subsequently, the desired trench is formed by etching the semiconductor substrate. Because the side wall layer 15' is formed on the side wall of the trench, contact spiking is prevented even in the case of misalignment of the contact pattern. Therefore, the impossibility of realizing a highly integrated semiconductor device due to contact spiking can be overcome.

From the foregoing, persons of ordinary skill in the art will appreciate that the above disclosed methods secure a process margin for misalignment of a contact pattern in order to facilitate the fabrication of more highly integrated semiconductor.

The illustrated method of forming a trench in a semiconductor device comprises: forming a hollow 100 by etching a portion of a semiconductor substrate 11; forming a side wall layer 15' on an inner side wall of the hollow 100; forming a trench by further etching the semiconductor substrate 11 exposed through the bottom of the hollow; and filling the trench by forming an insulation film 16 on the side wall layer and the trench.

Preferably, forming the side wall layer 15' on the inner side wall of the hollow 100 includes forming a sacrificial layer 15 on the hollow 100 and the semiconductor substrate 11; and forming the side wall layer 15' by etching back the sacrificial layer 15 such that the sacrificial layer 15 remains only on the inner side wall of the hollow 100.

Preferably, the sacrificial layer 15 is a silicon nitride film.

Preferably, the side wall layer 15' has a width of approximately 200–400 Å measured from the inner side wall of the hollow 100.

Preferably, before forming the hollow 100, a pad oxide film 12 and a polishing stop layer 13 is formed, wherein the hollow 100 is formed by etching the polishing stop layer 13, the pad oxide film 12 and the semiconductor substrate 11.

Preferably, the polishing stop layer 13 is a silicon nitride film formed at a thickness of approximately 1500–3000 Å.

Preferably, the pad oxide film 12 is formed at a thickness of approximately 100–300 Å.

Preferably, in filling the trench by forming the insulation film 16 on the side wall layer 15' and the trench, the insulation film 16 is formed to fill the trench on the entire surfaces of the polishing stop layer 13, the side wall layer 15' and the trench, and the insulation film 16 is then chemically mechanically polished until the polishing stop layer 13 is exposed.

Preferably, an oxide film is formed as the insulation film 16.

Preferably, before the insulation film 16 is formed, a liner oxide layer is formed on the side wall layer 15' and the trench, and the insulation film 16 is then formed on the liner oxide layer to fill the trench.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A semiconductor device comprising:
   a hollow formed in a semiconductor substrate, the hollow having a width;
   a trench formed in the semiconductor substrate, the trench having a decreasing width, a widest point of the decreasing width being less than a narrowest point of the width of the hollow;
   a side wall layer formed on an inner side wall of the hollow, the side wall layer having a thickness which is dependent upon a depth of the hollow, wherein the side wall layer has an upper portion and a lower portion, the lower portion being disposed at an obtuse angle relative to the upper portion; and
   an insulation film formed on the side wall layer and the trench for filling the trench.

2. A semiconductor device as defined in claim 1, wherein the side wall layer is formed at a predetermined height from a top surface of the semiconductor substrate.

3. A semiconductor device as defined in claim 1, wherein a height of the side wall layer is less than a depth of the hollow.

4. A semiconductor device as defined in claim 1, wherein the side wall layer has a width of approximately 200–400 Å measured from the inner side wall of the hollow.

5. A semiconductor device as defined in claim 1, wherein the side wall layer comprises a silicon nitride film.

6. A semiconductor device as defined in claim 1, wherein the insulation film comprises an oxide film.

7. A semiconductor device comprising:
   a hollow formed in a semiconductor substrate, the hollow having an upper portion having a uniform width and substantially parallel side walls and a lower portion having side walls which are inwardly inclined at a substantial angle relative to a horizontal plane;
   a trench formed in the semiconductor substrate beneath the hollow, the trench and the hollow being in communication;
   a side wall layer formed on an inner side wall of the hollow, wherein the side wall layer has an upper portion and a lower portion, the lower portion being disposed at an obtuse angle relative to the upper portion; and
   an insulation film formed on the side wall layer and the trench for filling the trench.

8. A semiconductor device as defined in claim 7, wherein the side wall layer is formed at a predetermined height from a top surface of the semiconductor substrate.

9. A semiconductor device as defined in claim 7, wherein a height of the side wall layer is less than a depth of the trench.

10. A semiconductor device as defined in claim 7, wherein the side wall layer has a width of approximately 200–400 Å measured from the an inner side wall of the hollow.

11. A semiconductor device as defined in claim 7, wherein the side wall layer comprises a silicon nitride film.

12. A semiconductor device as defined in claim 7, wherein the insulation film comprises an oxide film.

13. A semiconductor device as defined in claim 7, wherein a widest point of the trench is narrower than a widest point of the hollow.

14. A semiconductor device as defined in claim 7, wherein the side wall layer has a thickness which is dependent upon a depth of the hollow.

15. A semiconductor device as defined in claim 7, wherein the trench has a decreasing width, a widest point of the decreasing width being less than a narrowest point of a width of the hollow.

* * * * *